(12) United States Patent
Yu et al.

(10) Patent No.: US 12,218,252 B2
(45) Date of Patent: Feb. 4, 2025

(54) SEMICONDUCTOR STRUCTURE WITH SOURCE AND DRAIN ELECTRODE EMBEDDED WITHIN SEMICONDUCTOR LAYER AND MANUFACTURING METHOD THEREOF

(71) Applicant: TAIWAN SEMICONDUCTOR MANUFACTURING COMPANY LTD., Hsinchu (TW)

(72) Inventors: Chia-Jung Yu, Hsinchu (TW); Pin-Cheng Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 583 days.

(21) Appl. No.: 17/460,969

(22) Filed: Aug. 30, 2021

(65) Prior Publication Data

US 2023/0068105 A1 Mar. 2, 2023

(51) Int. Cl.
*H01L 29/78* (2006.01)
*H01L 29/417* (2006.01)
*H01L 29/66* (2006.01)
*H01L 29/786* (2006.01)
*H10B 61/00* (2023.01)

(52) U.S. Cl.
CPC .. *H01L 29/78696* (2013.01); *H01L 29/41733* (2013.01); *H01L 29/66969* (2013.01); *H10B 61/22* (2023.02); *H01L 29/7869* (2013.01)

(58) Field of Classification Search
CPC ......... H01L 29/78696; H01L 29/41733; H01L 29/66969; H01L 29/7869; H01L 27/1225; H10B 61/22; H10N 50/01
USPC .......................................................... 257/66
See application file for complete search history.

(56) References Cited

U.S. PATENT DOCUMENTS

| | | | | |
|---|---|---|---|---|
| 2008/0283751 A1* | 11/2008 | Kymissis | ................... | G01J 5/34 |
| | | | | 250/338.3 |
| 2014/0353662 A1* | 12/2014 | Shukh | ..................... | H10B 63/30 |
| | | | | 257/43 |
| 2019/0267319 A1* | 8/2019 | Sharma | ................. | H01L 29/786 |
| 2023/0027402 A1* | 1/2023 | Yamazaki | ........... | H01L 21/0262 |

* cited by examiner

*Primary Examiner* — Mohammad M Hoque
(74) *Attorney, Agent, or Firm* — WPAT LAW; Anthony King

(57) ABSTRACT

A semiconductor structure and a method for forming the semiconductor structure are disclosed. The semiconductor structure includes a dielectric layer and a transistor. The transistor is at least partially disposed in the dielectric layer. The transistor includes a gate electrode, a gate dielectric layer, a source electrode, a drain electrode and a semiconductor layer. The gate dielectric layer is disposed over the gate electrode. The source electrode and the drain electrode are disposed over the gate dielectric layer and contact the gate dielectric layer. The semiconductor layer is disposed over the gate dielectric layer.

20 Claims, 14 Drawing Sheets

SEMICONDUCTOR STRUCTURE WITH SOURCE AND DRAIN ELECTRODE EMBEDDED WITHIN SEMICONDUCTOR LAYER AND MANUFACTURING METHOD THEREOF

BACKGROUND

Electronic equipment involving semiconductor devices is essential for many modern applications. Technological advances in materials and design have produced generations of semiconductor devices, in which each generation includes smaller and more complex circuits than the previous generation. The semiconductor integrated circuit (IC) industry has produced a wide variety of digital devices to address issues in a number of different areas. Some of these digital devices, such as memory devices, are configured for the storage of data. A suitable level of resistance in the channel region between the source and the drain of the selector for the memory device is crucial for proper performance of the memory device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2O are cross-sectional views illustrating a semiconductor structure at various fabrication stages according to aspects of the present disclosure in one or more embodiments.

DETAILED DESCRIPTION

Figure 1:
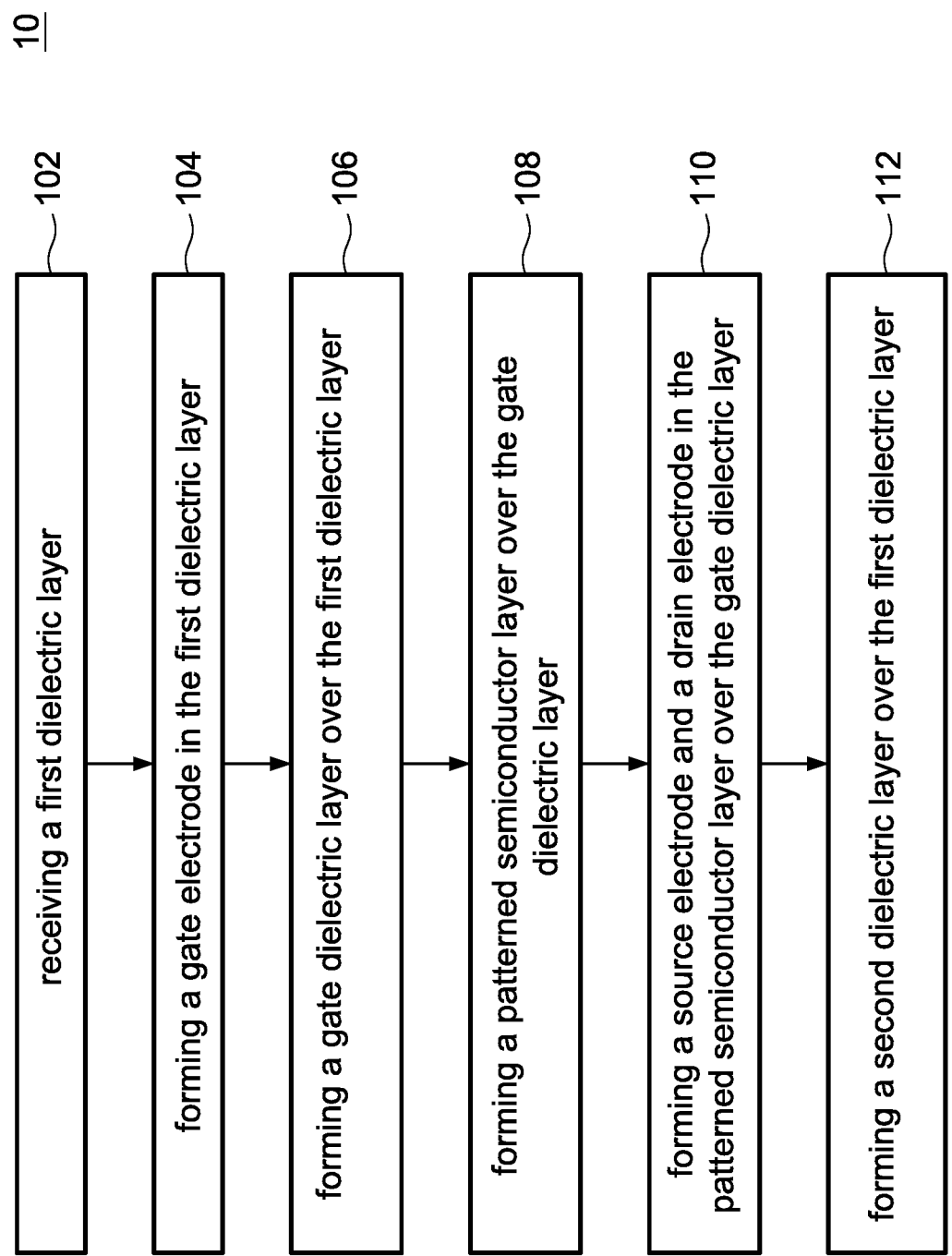
FIG. 1 is a flowchart representing a method for forming a semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A semiconductor memory, such as a magnetic random-access memory (MRAM), may include an array of densely-packed MRAM units. In each MRAM unit, a data-storage element, such as a magnetic tunneling junction (MTJ) element, may be integrated with a transistor to perform write and read operations. A suitable level of resistance of the channel region between the source and the drain of the transistor for the MRAM unit is crucial for proper performance of the MTJ element. In some embodiments, the resistance of the channel region between the source and the drain is high due to the long current path between the source and the drain. High resistance will cause the current to decrease. As the dimensions of the transistor decrease, the issue of high resistance becomes severe and the device performance may be reduced.

Embodiments of a semiconductor structure and a method for forming the same are therefore provided. The semiconductor structure is formed in a back end of the line (BEOL) circuit level in accordance with the embodiments. The semiconductor structure can be formed above a front end of the line (FEOL) circuit level. The semiconductor structure can be integrated with the memory element in the interconnection structure in the BEOL circuit level. In some embodiments, the semiconductor structure is served as a selector for the MRAM units. In some embodiments, the source electrode and the drain electrode of the semiconductor structure contact the gate dielectric layer. The current path between the source electrode and the drain electrode may be reduced. Accordingly, the high resistance issue can be mitigated.

FIG. 1 is a flowchart representing a method 10 for forming a semiconductor structure according to aspects of the present disclosure. It should be understood that additional operations can be provided before, during, and after the method 10, and some operations described can be replaced, eliminated, or moved around for additional embodiments of the method. The method 10 for forming a semiconductor structure 20 includes an operation 102 where a first dielectric layer is received. In some embodiments, the first dielectric layer may be one of the dielectric layers in the BEOL circuit level. The method 10 further includes an operation 104 where a gate electrode is formed in the first dielectric layer. The method 10 further includes an operation 106 where a gate dielectric layer is formed over the first dielectric layer. The method 10 further includes an operation 108 where a patterned semiconductor layer is formed over the gate dielectric layer. The method 10 further includes an operation 110 where a source electrode and a drain electrode are formed in the patterned semiconductor layer over the gate dielectric layer. In some embodiments, the source electrode or the drain electrode is horizontally aligned with the patterned semiconductor layer. The method 10 further includes an operation 112 where a second dielectric layer is formed over the first dielectric layer. In some embodiments, the method 10 further includes forming a memory element over the second dielectric layer. In some embodiments, the operation 112 further includes patterning the second dielectric layer and forming a drain via in the patterned second dielectric layer. In some embodiments, the drain via electrically connects the drain electrode to the memory element.

Figure 2B:
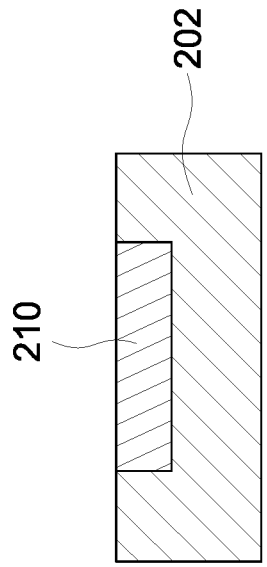
Figure 2A:
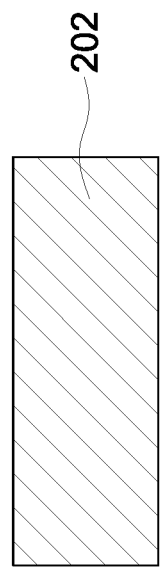
Figure 2D:
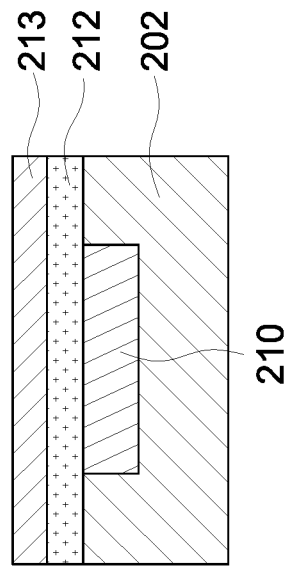
Figure 2C:
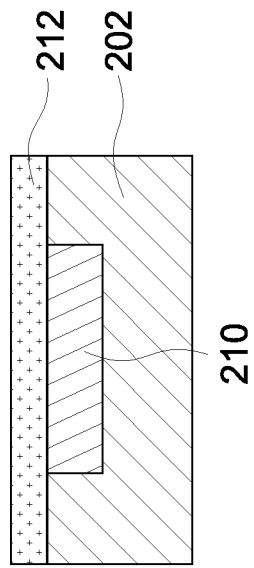
Figure 2E:
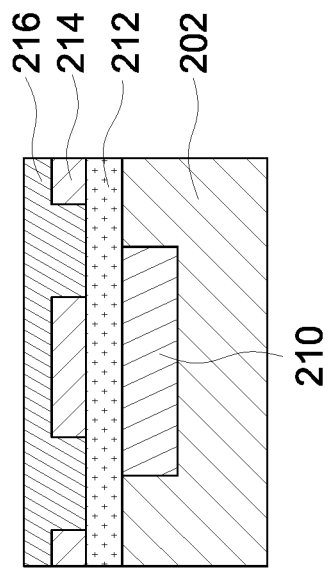
Figure 2F:
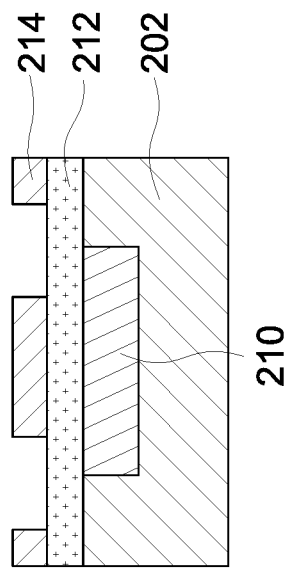
Figure 2H:
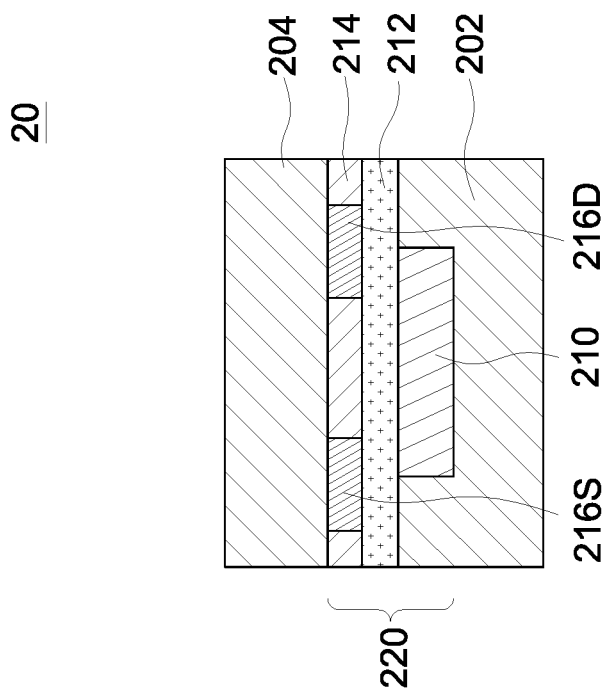
Figure 2G:
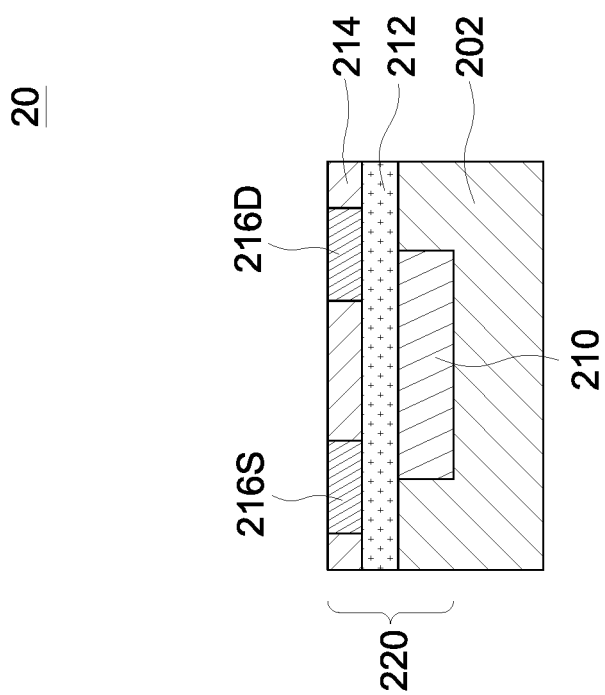
Figure 2I:
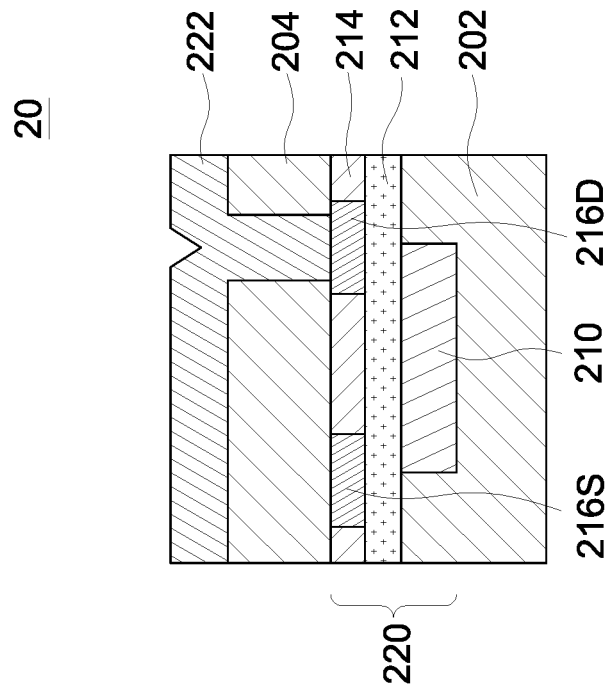
Figure 2J:
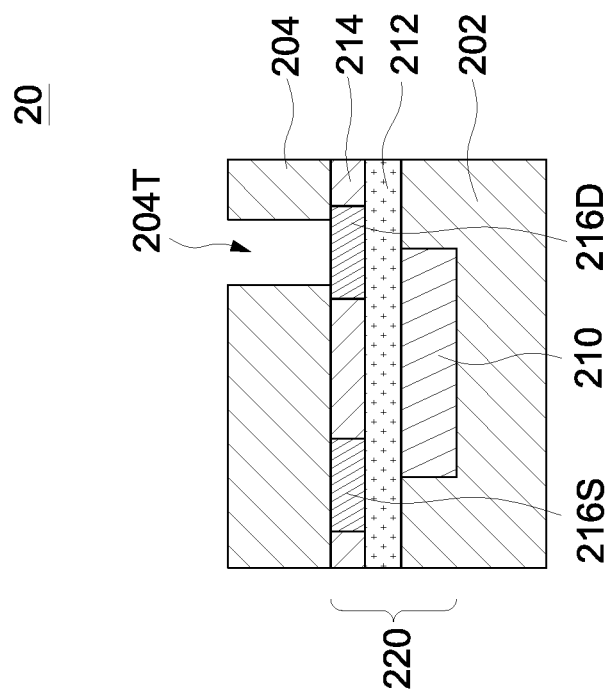
Figure 2L:
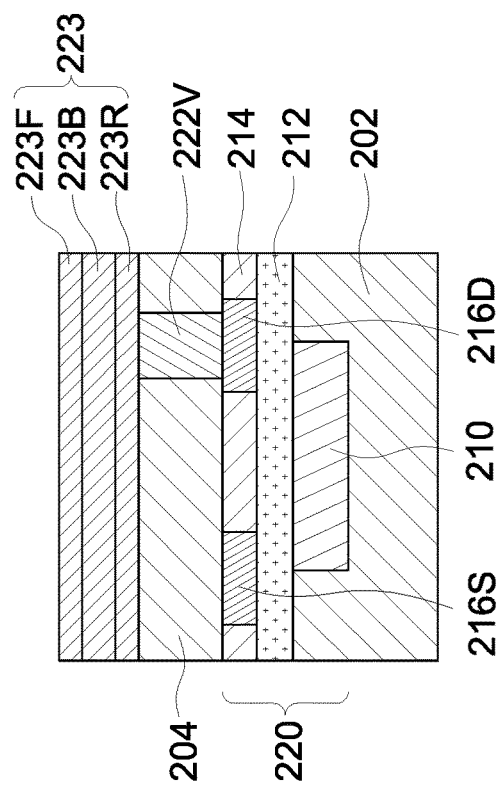
Figure 2K:
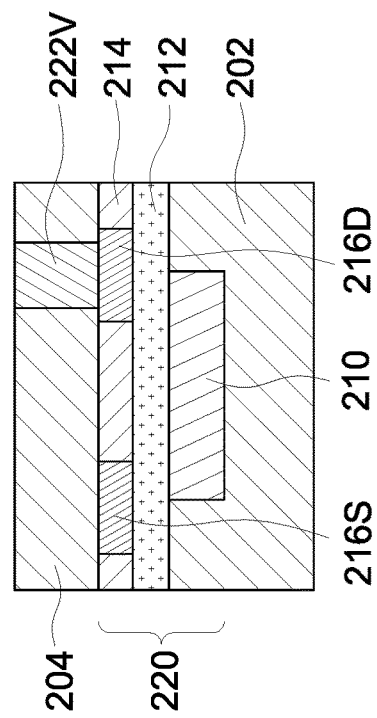
Figure 2N:
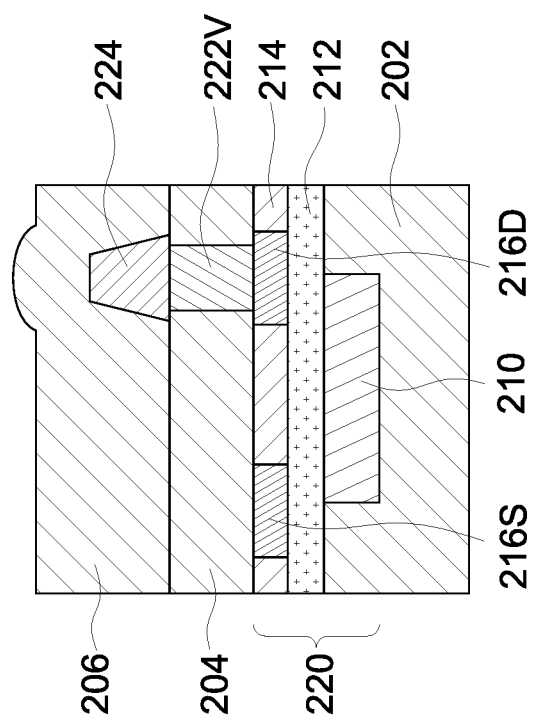
Figure 2M:
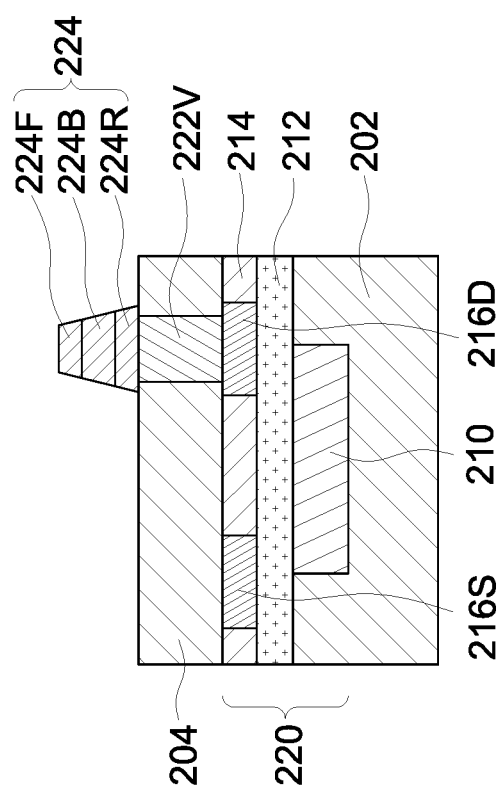
Figure 2O:
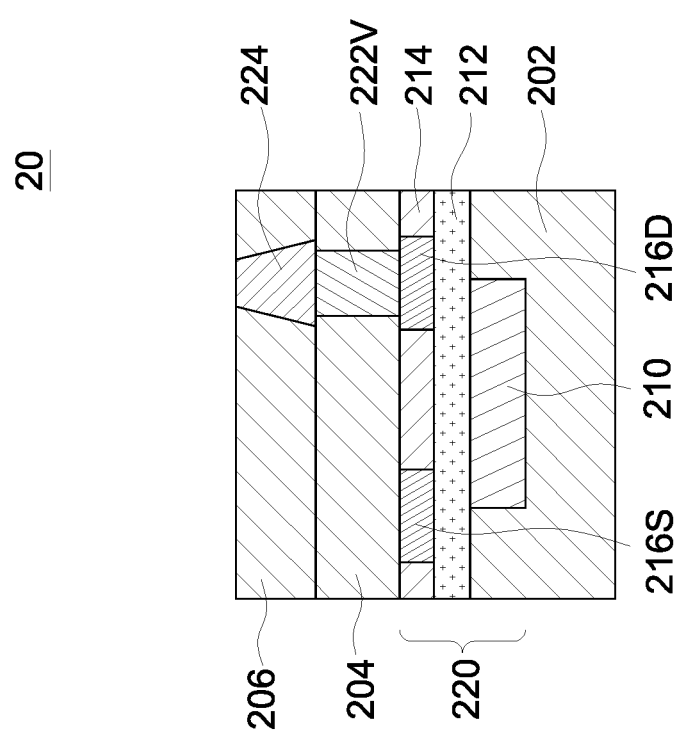

FIGS. 2A-2O are cross-sectional views illustrating a semiconductor structure 20 at various fabrication stages according to aspects of the present disclosure in one or more embodiments. Referring to FIG. 2A, a first dielectric layer 202 is received according to operation 102. The first dielectric layer 202 may be an inter-metal dielectric layer. In some embodiments, the first dielectric layer 202 may be an inter-layer dielectric layer. In some embodiments, the first dielectric layer 202 may be one of the dielectric layers in the BEM, circuit level. The first dielectric layer 202 may provide electrical insulation as well as structural support for the various features during subsequent fabrication operations. In some embodiments, the first dielectric layer 202 may be formed of low-κ dielectric material. In some embodiments, the first dielectric layer 202 includes materials such as spin-on dielectric (SOD), spin-on glass, spin-on polymers, silicon carbon material, un-doped silicate glass, or doped silicon oxide such as phosphor-silicate glass (PSG), boro-phosphosilicate glass (BPSG), fluorinated silicate glass (FSG), compounds thereof, composites thereof, combinations thereof, and/or other suitable dielectric materials. In some embodiments, the first dielectric layer 202 may include silicon oxide (SiO), but the disclosure is not limited thereto.

Referring to FIG. 2B, a gate electrode 210 is formed in the first dielectric layer 202 according to operation 104. The gate electrode 210 can be formed by a single damascene process. For example, an opening (not shown) is formed in the first dielectric layer 202. The opening may be formed by photolithography techniques. After the opening is formed, a gate conductive material may be formed in the opening of the first dielectric layer 202. The opening of the first dielectric layer 202 may be filled with the gate conductive material by, for example, performing a deposition process to a thickness such that the opening is at least substantially filled. In some embodiments, after the gate conductive material is deposited, a planarization process, such as a chemical mechanical planarization (CMP) operation, may be performed to form the gate electrode 210. Consequently, the first dielectric layer 202 surrounds the gate electrode 210. In other words, the gate electrode 210 is embedded in the first dielectric layer 202, while a top surface of the gate electrode 210 remains exposed, as shown in FIG. 2B. The gate electrode 210 may include conductive materials. The conductive materials may include metal, elemental metals, transition metals, or the like. Examples of metal materials may include, for example but not limited thereto, TiN, Ti, or W.

Referring to FIG. 2C, a gate dielectric layer 212 is formed over the first dielectric layer 202 according to operation 106. The gate dielectric layer 212 may be formed by a deposition process. In some embodiments, the gate dielectric layer 212 is conformally formed over the gate electrode 210 and the first dielectric layer 202. The gate dielectric layer 212 covers a top surface of the gate electrode 210 as shown in FIG. 2C. In some embodiments, the gate dielectric layer 212 includes a high-K dielectric material having a high dielectric constant. The high-κ dielectric material may include hafnium dioxide ($HfO_2$), zirconium dioxide ($ZrO_2$), aluminum oxide ($Al_2O_3$), lanthanum oxide ($La_2O_3$), titanium oxide ($TiO_2$), yttrium oxide ($Y_2O_3$), strontium titanate ($SrTiO_3$), hafnium oxynitride ($HfO_xN_y$), hafnium silicate, zirconium silicate, other suitable metal-oxides, metal silicates, or combinations thereof. In some embodiments, a thickness of the gate dielectric layer 212 is within a range of approximately 1 angstrom to approximately 30 angstroms, but the disclosure is not limited thereto.

Referring to FIGS. 2D-2E, a patterned semiconductor layer 214 is formed over the gate dielectric layer 212 according to operation 108. A semiconductor layer 213 may be formed over the gate dielectric layer 212 by a deposition process. In some embodiments, after the semiconductor layer 213 is deposited, a patterning process may be performed to form the patterned semiconductor layer 214. In some embodiments, a patterned hard mask (not shown) can be formed over the semiconductor layer 213 for defining a location and a dimension of the patterned semiconductor layer 214. In some embodiments, the patterned hard mask may include silicon nitride (SiN), but the disclosure is not limited thereto. In some embodiments, the underlying gate dielectric layer 212 may be served as an etch stop layer during the patterning process. In some embodiments, the patterned semiconductor layer 214 includes semiconductive materials, such as oxide semiconductors. Examples of semi-conductive materials may include, for example but not limited thereto, amorphous indium gallium zinc oxide (IGZO), c-axis aligned crystal (CAAC)-IGZO, ZnO, $In_2O_3$, Ga$_2$O$_3$, and ZnON. In some embodiments, a thickness of the patterned semiconductor layer 214 is within a range of approximately 1 angstrom to approximately 30 angstroms, but the disclosure is not limited thereto.

Referring to FIGS. 2F-2G, a source electrode 216S and a drain electrode 216D are formed in the patterned semiconductor layer 214 over the gate dielectric layer 212 according to operation 110. In some embodiments, after the patterned semiconductor layer 214 is formed, a source/drain conductive material 216 may be formed in the openings of the patterned semiconductor layer 214. The openings of the patterned semiconductor layer 214 may be filled with the source/drain conductive material 216 by, for example, performing a deposition process to a thickness such that the openings are at least substantially filled. In some embodiments, after the source/drain conductive material 216 is deposited, a planarization process may be performed to form the source electrode 216S and the drain electrode 216D as shown in FIG. 2G. Consequently, the patterned semiconductor layer 214 surrounds the source electrode 216S and/or the drain electrode 216D. In other words, the source electrode 216S and the drain electrode 216D are embedded in the patterned semiconductor layer 214, while top surfaces of the source electrode 216S and the drain electrode 216D remain exposed, as shown in FIG. 2G. In some embodiments, a thickness of the source electrode 216S or a thickness of the drain electrode 216D is substantially equal to a thickness of the patterned semiconductor layer 214.

In some embodiments, the source electrode 216S or the drain electrode 216D is horizontally aligned with the patterned semiconductor layer 214. In some embodiments, a bottom surface of the source electrode 216S or a bottom surface of the drain electrode 216D is horizontally aligned with a bottom surface of the patterned semiconductor layer 214. In some embodiments, the bottom surfaces of the source electrode 216S and the drain electrode 216D are level with the bottom surface of the patterned semiconductor layer 214. In some embodiments, a top surface of the source electrode 216S or a top surface of the drain electrode 216D is horizontally aligned with a top surface of the patterned semiconductor layer 214. In some embodiments, the top surfaces of the source electrode 216S and the drain electrode 216D are level with the top surface of the patterned semiconductor layer 214. In some embodiments, a sidewall of the source electrode 216S or a sidewall of the drain electrode 216D contacts a sidewall of the patterned semiconductor layer 214. In some embodiments, the source electrode 216S and the drain electrode 216D further contact the gate dielectric layer 212. The source electrode 216S and the drain electrode 216D may include conductive materials. The conductive materials may include metal, elemental metals, transition metals, or the like. Examples of metal materials may include, for example but not limited thereto, TiN, Ti, or W. As used herein, the term "contact" generally means "direct contact" or "physically contact". For example, the source electrode 216S and the drain electrode 216D are in direct contact with the gate dielectric layer 212.

The spatially relative phrase "horizontally aligned with" may be used herein to describe a situation where a surface of one element is substantially coplanar with a surface of another element. The term "substantially coplanar" may generally mean that a level difference between the surface of one element and the surface of another element is within 10%, 5%, 1% or 0.5% of a height of the element. In some embodiments, the term "horizontally aligned with" means that a top surface of one element is substantially coplanar with a top surface of another element. In some embodiments, the term "horizontally aligned with" means that a bottom surface of one element is substantially coplanar with a bottom surface of another element. In some embodiments, the term "horizontally aligned with" means that both the top surface and the bottom surface of one element are substantially coplanar with both the top surface and the bottom surface of another element.

Referring to FIG. 2G again, a transistor 220, including the gate electrode 210, the gate dielectric layer 212, the patterned semiconductor layer 214, the source electrode 216S, and the drain electrode 216D, is at least partially disposed in the first dielectric layer 202. In some embodiments, the transistor 220 is disposed in an interconnection structure. In some embodiments, the transistor 220 is embedded in one of the dielectric layers in the BEOL circuit level, in some embodiments, the transistor 220 may be a thin-film transistor (TFT). In some embodiments, the transistor 220 may be a memory selector. In some embodiments, the transistor 220 is configured to access a corresponding memory element.

Referring to FIG. 2H, a second dielectric layer 204 is formed over the first dielectric layer 202 according to operation 112. The second dielectric layer 204 may be formed over the patterned semiconductor layer 214, the source electrode 216S and the drain electrode 216D. The second dielectric layer 204 can be formed by a deposition process. The deposition process includes chemical vapor deposition (CVD), physical vapor deposition (PVD), atomic layer deposition (ALD), other suitable methods, and/or combinations thereof. In some embodiments, a bottom surface of the second dielectric layer 204 contacts the top surface of the patterned semiconductor layer 214, the top surface of the source electrode 216S and the top surface of the drain electrode 216D. The second dielectric layer 204 may provide electrical insulation as well as structural support for the various features during subsequent fabrication operations. Similar to the first dielectric layer 202, the second dielectric layer 204 may be one of the dielectric layers in the BEOL circuit level. Materials of the second dielectric layer 204 are the same as or similar to those discussed above with respect to the first dielectric layer 202, and repeated descriptions thereof are omitted for brevity.

Referring to FIG. 2I, the second dielectric layer 204 is patterned to form a trench 204T in the second dielectric layer 204. In some embodiments, the trench 204T exposes the top surface of the drain electrode 216D. For example, the trench 204T can be formed by a procedure including photolithography patterning and etching processes. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching).

Referring to FIGS. 2J-2K, a drain via 222V is formed in the patterned second dielectric layer 204. In some embodiments, after the second dielectric layer 204 is patterned, a conductive material 222 may be formed in the opening of the second dielectric layer 204. The opening of the second dielectric layer 204 may be filled with the conductive material 222 by, for example, performing a deposition process to a thickness such that the opening is at least substantially filled. In some embodiments, after the conductive material 222 is deposited, a planarization process may be performed to form the drain via 222V as shown in FIG. 2K. Consequently, the top surface of the drain via 222V is level with the top surface of the second dielectric layer 204.

In some embodiments, a thickness of the drain via 222V is substantially equal to a thickness of the second dielectric layer 204. In some embodiments, the bottom surface of the drain via 222V is level with the top surface of the patterned semiconductor layer 214.

Referring to FIGS. 2L-2M, a memory element 224 is formed over the second dielectric layer 204. A memory stack 223 may be formed over the second dielectric layer 204 by a deposition process. The memory element 224 may be fabricated by patterning the memory stack 223 with photolithography. The memory stack 223 may include a reference layer 223R, a free layer 223F and a tunnel barrier layer (TBL) 223B. In some embodiments, a bottom surface of the memory element 224 contacts the top surface of the drain via 222V. The drain via 222V electrically connects the drain electrode 2161) of the transistor 220 to the memory element 224. In some embodiments, the memory element 224 may be a data-storage element, such as a magnetic tunneling junction (MTJ) element, or another type of memory element, such as a resistive switching element. In some embodiments, the transistor 220 is served as a selector for the memory element 224.

The memory element 224 includes the patterned reference layer 224R, the patterned free layer 224F and the patterned tunnel barrier layer 224B. In some embodiments, the reference layer 224R and the free layer 224F are separated by the TBL 224B. The reference layer 224R has a fixed magnetization direction, while the free layer 224F has a variable magnetization direction. In some embodiments, if the magnetization directions of the reference layer 224R and the free layer 224F are in a parallel orientation (a parallel state), it is easier for conduction electrons to tunnel through the TBL 224B, such that the memory element 224 is in a low-resistance state. Conversely, if the magnetization directions of the reference layer 224R and the free layer 224F are in an antiparallel orientation (an antiparallel state), it is more difficult for conduction electrons to tunnel through the TBL 224B, such that the memory element 224 is in a high-resistance state.

Referring to FIG. 2N, a third dielectric layer 206 may be formed over the second dielectric layer 204. The third dielectric layer 206 can be formed by a deposition process. The third dielectric layer 206 may be conformally formed over the second dielectric layer 204 and the memory element 224. The third dielectric layer 206 may cover the top surface and sidewalls of the memory element 224. The third dielectric layer 206 may provide electrical insulation as well as structural support for the various features during subsequent fabrication operations. Similar to the second dielectric layer 204, the third dielectric layer 206 may be one of the dielectric layers in the BEOL circuit level, Materials of the third dielectric layer 206 are the same as or similar to those discussed above with respect to the first dielectric layer 202, and repeated descriptions thereof are omitted for brevity.

Referring to FIG. 2O, after the third dielectric layer 206 is deposited, a planarization process may be performed. Consequently, the third dielectric layer 206 surrounds the memory element 224. In some embodiments, the top surface of the memory element 224 is level with the top surface of the third dielectric layer 206. In some embodiments, a thickness of the memory element 224 is substantially equal to a thickness of the third dielectric layer 206. In some embodiments, the bottom surface of the third dielectric layer 206 is level with the top surface of the drain via 222V. In some embodiments, the third dielectric layer 206 and the second dielectric layer 204 may be considered as a single dielectric layer in the BEOL circuit level.

In some embodiments, both the source electrode 216S and the drain electrode 216D of the semiconductor structure 20 are embedded in the patterned semiconductor layer 214. Accordingly, a shorter current path is expected compared to that of a semiconductor structure with the source electrode and the drain electrode over the semiconductor layer. The semiconductor structure with the source electrode and the drain electrode over the semiconductor layer would have a longer current path between the source electrode and the drain electrode. In some embodiments, the resistance of the semiconductor structure with the source electrode and the drain electrode over the semiconductor layer is high due to the long current path and inconsistent doping concentration in the semiconductor layer. The shorter current path of the semiconductor structure 20 can be achieved because the source electrode 216S and the drain electrode 216D are recessed in the patterned semiconductor layer 214. Accordingly, the high resistance issue can be mitigated.

Figure 3:
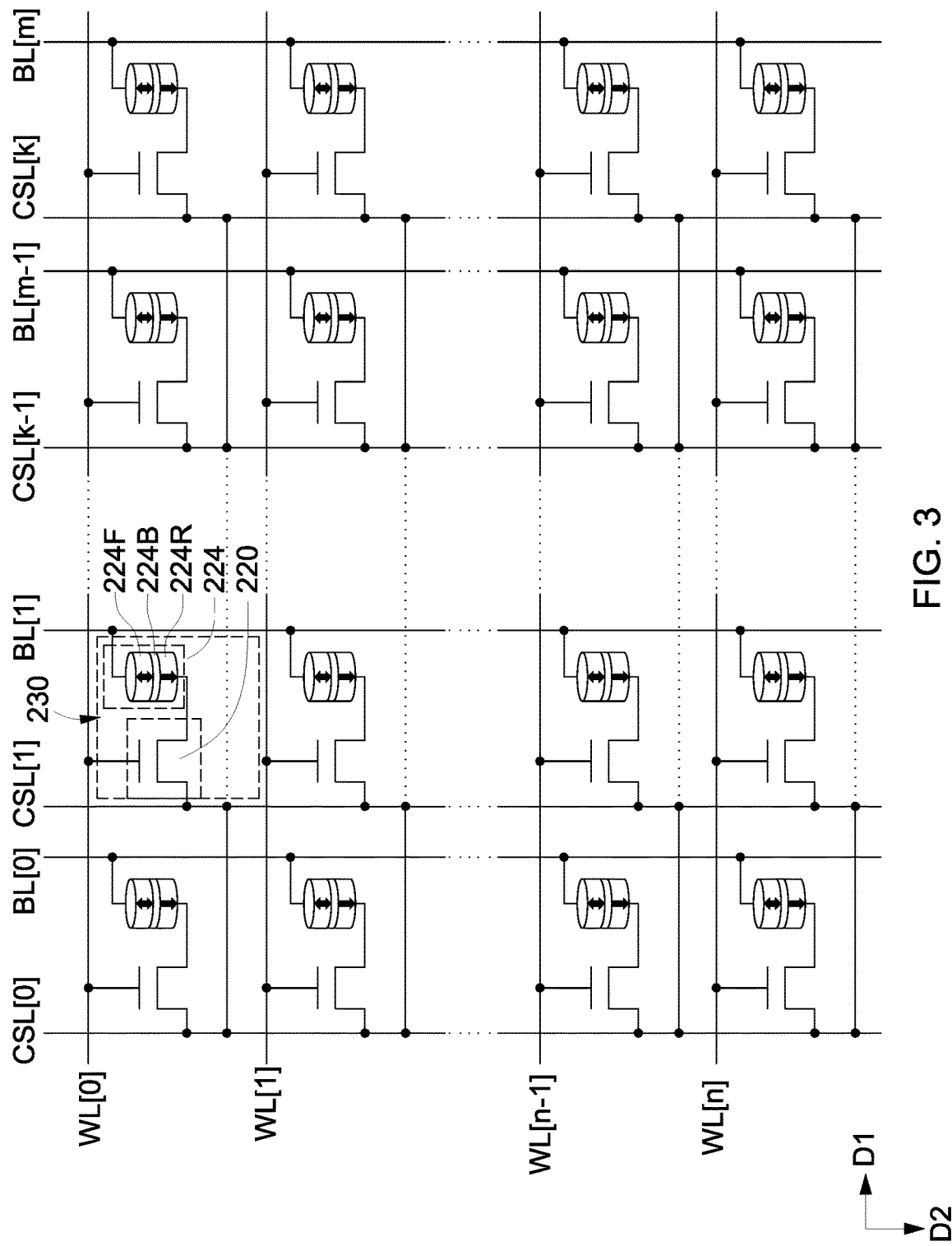
FIG. 3 is a schematic diagram illustrating a memory array according to aspects of the present disclosure in one or more embodiments.

In some embodiments, the transistor 220 is served as a selector for the memory element 224. FIG. 3 is a schematic diagram illustrating a memory array 30 according to aspects of the present disclosure in one or more embodiments, Referring to FIG. 3, the memory array 30 includes the memory elements 224 and transistors 220. In some embodiments, the memory array 30 includes memory units 230, in which each memory unit 230 includes one transistor 220 and one memory element 224. In some embodiments, the memory unit 230 may be an MRAM unit. In some embodiments, the transistors 220 are configured to access the corresponding memory elements 224.

The memory array 30 further includes bit lines BL, word lines WL and common source lines CSL. The bit lines BL are labeled BL[0] through BL[m] in a first direction D1, the word lines are labeled WL[0] through WL[n] in a second direction D2 and the common source lines CSL are labeled CSL[0] through CSL[k] in the first direction D1, The second direction D2 is perpendicular to the first direction D1. The bit line BL is electrically coupled to one end of the corresponding memory element 224. In some embodiments, the bit line BL is coupled to one end of the memory element 224 through a top electrode under a metal wire (not shown). The common source line CSL is coupled to an opposite end of the corresponding memory element 224 through the corresponding transistor 220. In some embodiments, a single common source line CSL is coupled to a number of transistors 220 in the second direction D2. In some embodiments, application of a suitable word line WL voltage to the gate electrode 210 of the transistor 220 controls the flow of electrons (or electron holes) of the memory element 224 between the bit line BL and the common source line CSL. Consequently, by providing suitable biasing conditions, the memory element 224 can be switched between two states of electrical resistance, i.e., a first state with a low resistance (wherein magnetization directions of the free layer 224F and the reference layer 224R are parallel) and a second state with a high resistance (wherein magnetization directions of the free layer 224F and the reference layer 224R are antiparallel), to store data.

The gate electrode 210 of the transistor 220 may be electrically connected to the word line WL, such as the word line WL[0]. The source electrode 216S of the transistor 220 may be electrically connected to the common source line CSL, such as the common source line CSL[1]. The drain electrode 216D of the transistor 220 may be electrically connected to the memory element 224 and the bit line BL, such as the bit line BL[1]. In some embodiments, the drain via 222V electrically connects the drain electrode 216D of the transistor 220 to the memory element 224 and the bit line BL[1].

The semiconductor structure 20 may undergo further processes to form various features such as contacts/vias, interconnect metal layers, dielectric layers, passivation layers, etc. In some embodiments, prior to the formation of the semiconductor structure 20, a FEOL circuit level may be formed. In some embodiments, the semiconductor structure 20 may be embedded in the BEOL circuit level.

Figure 4:
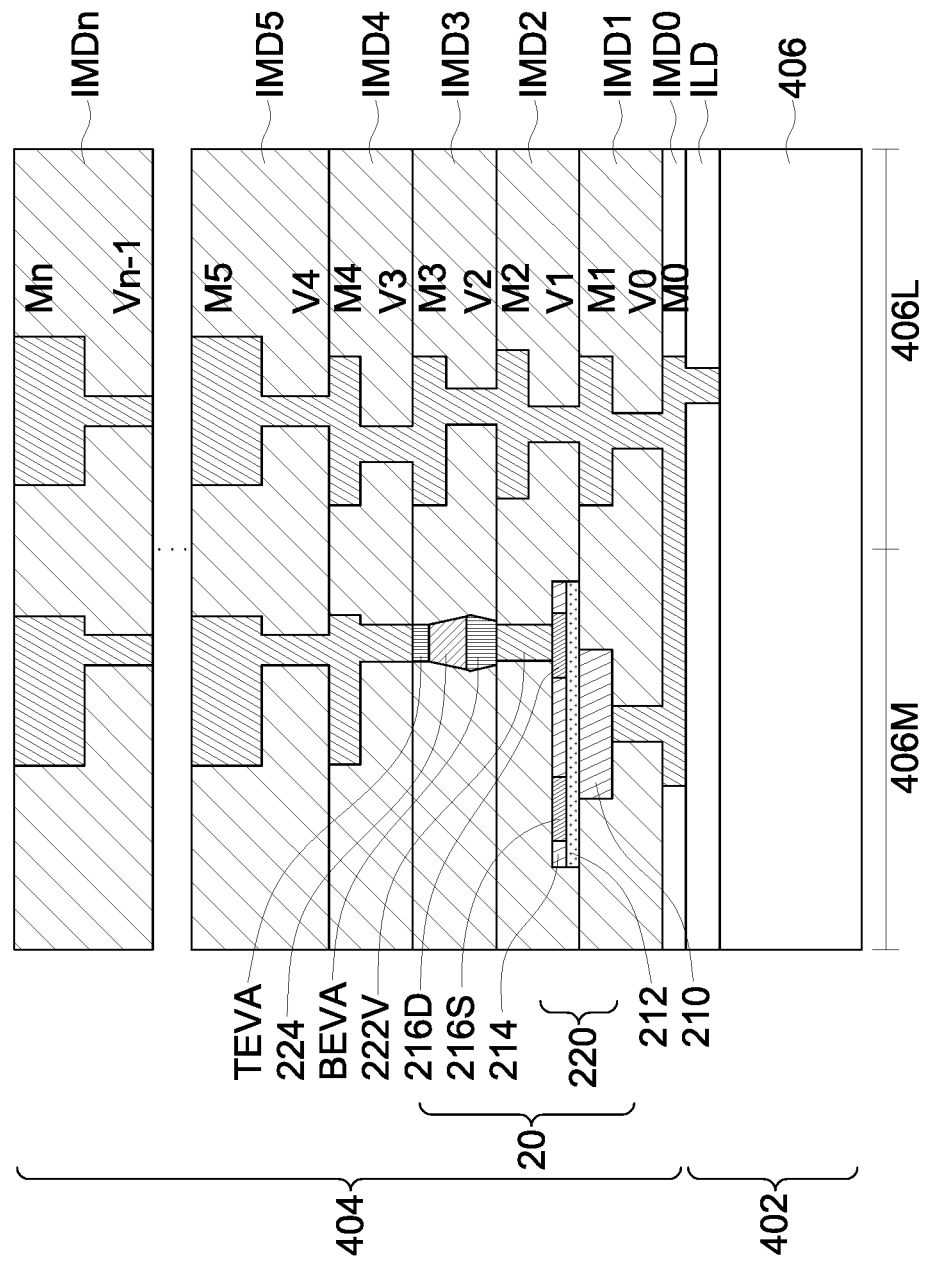
FIG. 4 is a cross-sectional view illustrating a semiconductor device according to aspects of the present disclosure in one or more embodiments.

FIG. 4 is a cross-sectional view illustrating a semiconductor device 40 according to aspects of the present disclosure in one or more embodiments. The semiconductor device 40 may have an active structure 402 in the FEOL circuit level and an interconnect structure 404 in the BEOL circuit level. The FEOL circuit level may include MOS transistors formed on a substrate 406. The MOS transistors include planar field effect transistors (FETs), fin FETs, and/or gate-all-around (GAA) FETs. The FEOL circuit level may further include local interconnects in some embodiments. The BEM, circuit level includes the interconnect structure 404, which includes one or more dielectric layers, conductive lines and vias embedded in the dielectric layers. In some embodiments, the semiconductor structure 20 may be embedded in the interconnection structure 404.

In some embodiments, the substrate 406 may include a semiconductor substrate. In some embodiments, the substrate 406 may include a plurality of functional regions. For example but not limited thereto, the substrate 406 can include a memory region 406M and a logic region 406L that are defined by isolation structures (not shown) and are electrically isolated from other functional regions by the isolation structures. The memory region 406M may include a plurality of the memory units 230 as shown in FIG. 3. The logic region 406L may include circuitry for processing information received from the memory units 230 and for controlling reading and writing functions of the memory units 230. The FEOL circuit level may include an interlayer dielectric layer ILD disposed over the substrate 406. In some embodiments, components such as conductive line layers, source vias, drain vias and gate contact plugs are formed in the interlayer dielectric layer ILD.

The interconnect structure 404 is disposed over the interlayer dielectric layer ILD, In some embodiments, the interconnect structure 404 includes a plurality of conductive lines Mn, e.g., M0 through M5 and a plurality of vias Vn, e.g., V0 through V4, where n is a positive integer. The vias V0 through V4 electrically connect the conductive lines M0, M2 and M4 to the conductive lines M1, M3 and M5, respectively. In some embodiments, the conductive lines M0 through M5 may be configured as or electrically connected to the common source line CSL, the bit line BL and the word line WL as shown in FIG. 3. In some embodiments, the conductive lines M0 through M5 and the vias V0 through V4 can include TiN, Ti, W, Al, Cu, AlCu, or the like.

Further, the conductive lines M0 through M5 and the vias V0 through V4 are disposed in a plurality of dielectric layers IMDn, e.g., IMD0 through IMD5. The dielectric layers IMD0 through IMD5 may provide electrical insulation as well as structural support for the various features during subsequent fabrication operations. The dielectric layers IMD0 through IMD5 may include inter-metal dielectric layers. In some embodiments, the dielectric layers IMD0 through IMD5 may be formed of low-κ dielectric material, for example, material with K value lower than about 3.0, or even lower than about 2.5, but the disclosure is not limited thereto. The dielectric layers IMD0 through IMD5 may be similar to the first dielectric layer 202 discussed previously, and repeated descriptions thereof are omitted for brevity. In some embodiments, the interconnect structure 404 may further include etch stop layers, seal layers or oxide layers disposed between the dielectric layers IMD0 through IMD5.

In some embodiments, the semiconductor structure 20 can be arranged in the dielectric layers IMD1 through IMD3, but the disclosure is not limited thereto. In other words, the semiconductor structure 20 can be arranged in any one or more of the dielectric layers. In some embodiments, the memory element 224 can be arranged in dielectric layer IMD3, but the disclosure is not limited thereto. In other words, the memory element 224 can be arranged in and encapsulated by any one or more of the dielectric layers. In some embodiments, the transistor 220 can be arranged in and encapsulated by any one or more of the dielectric layers. In some embodiments, the memory element 224 and the transistor 220 may be separated by at least one dielectric layer. For example, the transistor 220 may be electrically connected to the memory element through the drain via 222V, a via Vn−1 and a conductive line Mn.

Referring to FIG. 4, the memory element 224 may be disposed between and coupled to a top electrode via TEVA and a bottom electrode via BEVA. In some embodiments, the memory element 224 is electrically connected to the via V3 and the conductive line M4 by the top electrode via TEVA, and electrically connected to the drain via 222V by the bottom electrode via BEVA. In some embodiments, a sum of a height of the via Vn−1 and a height of the conductive line Mn in the dielectric layer IMDn is substantially the same as a sum of a height of the memory element 224, a height of the top electrode via TEVA and a height of the bottom electrode via. BEVA in the same dielectric layer IMDn.

Figure 5:
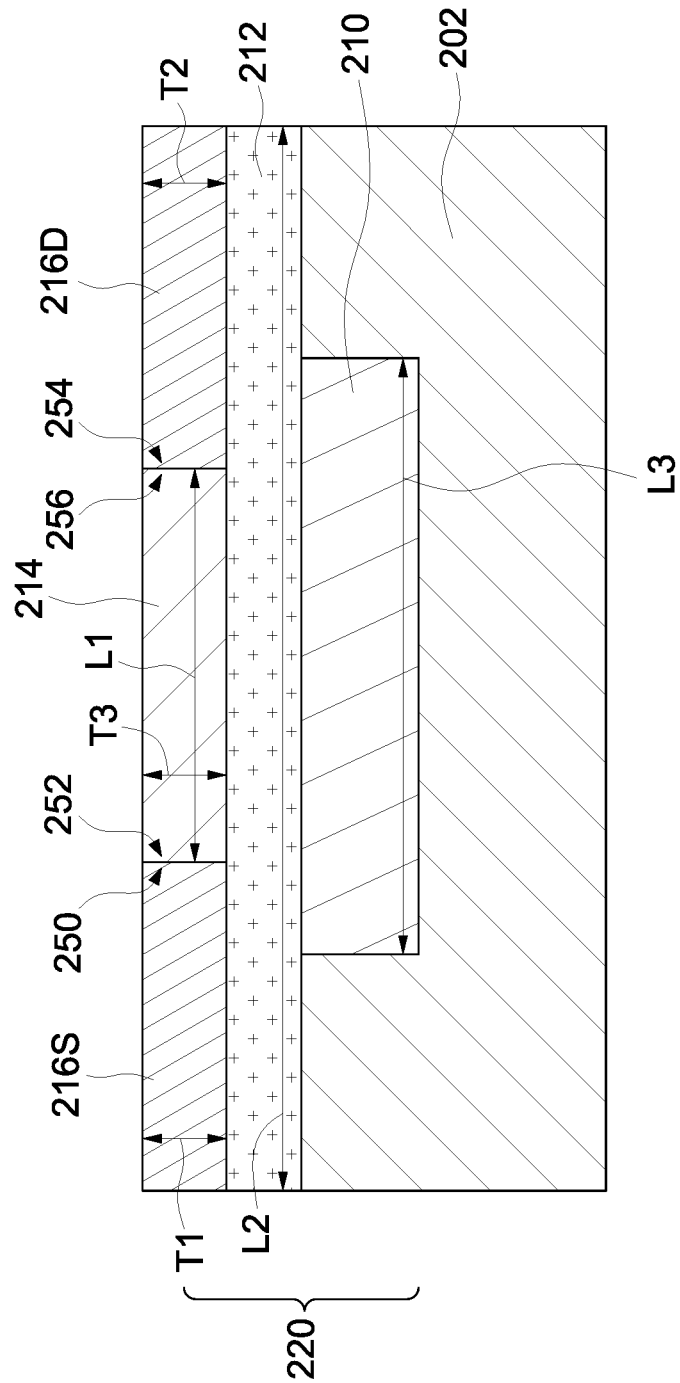
FIG. 5 is an enlarged view illustrating the semiconductor structure according to aspects of the present disclosure in one or more embodiments.

FIG. 5 is an enlarged view illustrating the semiconductor structure 20 according to aspects of the present disclosure in one or more embodiments. Referring to FIG. 5, the transistor 220 may be at least partially disposed in the first dielectric layer 202. The source electrode 216S and the drain electrode 216D are disposed over the gate dielectric layer 212 and contact the gate dielectric layer 212. In some embodiments, the gate electrode 210 is embedded in the first dielectric layer 202. In some embodiments, the source electrode 216S and the drain electrode 216D are horizontally aligned with the semiconductor layer 214. In some embodiments, the bottom surface of the source electrode 216S or the bottom surface of the drain electrode 216D is horizontally aligned with the bottom surface of the semiconductor layer 214. In some embodiments, a top surface of the source electrode 216S or a top surface of the drain electrode 216D is level with a top surface of the semiconductor layer 214.

In some embodiments, a length L1 of the semiconductor layer 214 is less than a length L2 of the gate dielectric layer 212. In some embodiments, the length L1 of the semiconductor layer 214 is less than or equal to a length L3 of the gate electrode 210. In some embodiments, a distance between the source electrode 216S and the drain electrode 216D is substantially equal to the length L1 of the semiconductor layer 214. In some embodiments, a thickness T1 of the source electrode 216S or a thickness T2 of the drain electrode 216D is substantially equal to a thickness T3 of the semiconductor layer 214. In some embodiments, a sidewall 250 of the source electrode 216S contacts a sidewall 252 of the semiconductor layer 214. In some embodiments, a sidewall 254 of the drain electrode 216D contacts a sidewall 256 of the semiconductor layer 214.

The structures and/or the methods of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 6:
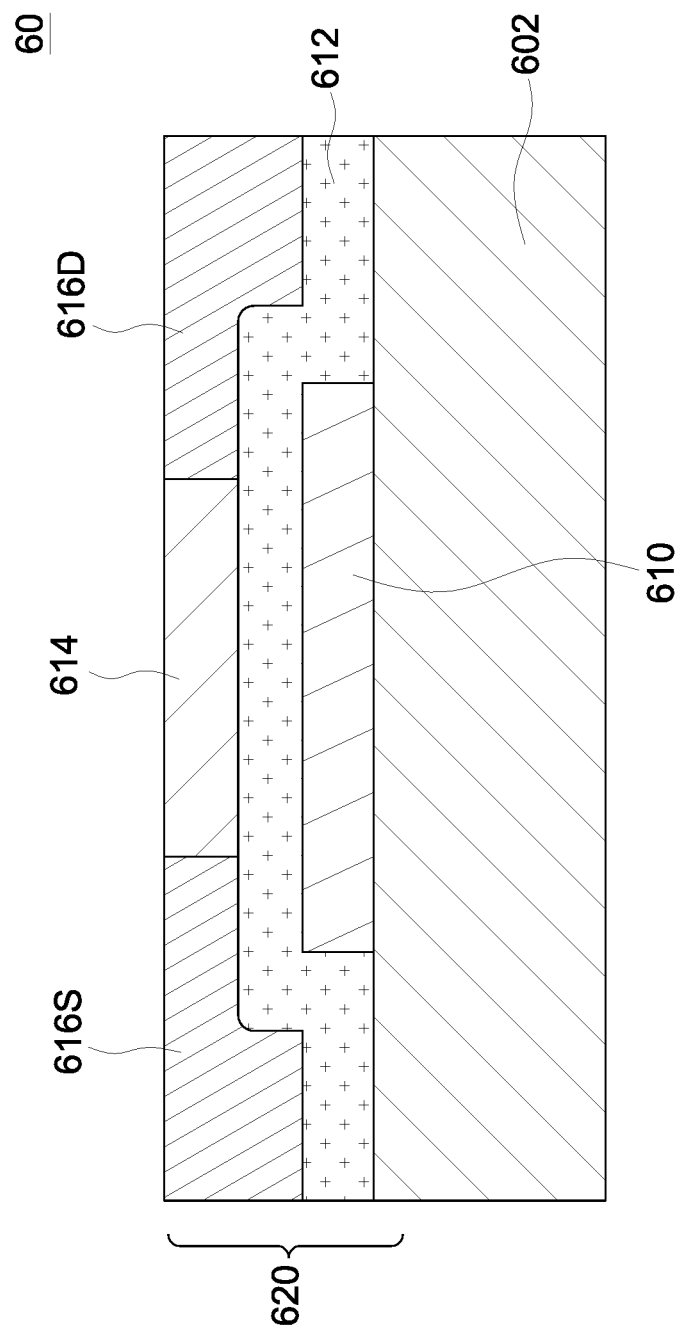
FIG. 6 is a cross-sectional view illustrating a semiconductor structure according to aspects of the present disclosure in one or more embodiments.

FIG. 6 is a cross-sectional view illustrating a semiconductor structure 60 according to aspects of the present disclosure in one or more embodiments. Referring to FIG. 6, the semiconductor structure 60 includes a dielectric layer 602 and a transistor 620. The transistor 620 may be arranged in any one or more of the dielectric layers shown in FIG. 4 as previously discussed. The transistor 620 may be disposed over the dielectric layer 602. Many aspects of the semiconductor structure 60 are similar to those of the semiconductor structure 20, and repeated descriptions thereof are omitted for brevity.

In some embodiments, the transistor 620 includes a gate electrode 610, a gate dielectric layer 612, a semiconductor layer 614, a source electrode 616S and a drain electrode 616D. The source electrode 616S and the drain electrode 616D are disposed over the gate dielectric layer 612 and contact the gate dielectric layer 612. In some embodiments, the gate electrode 610 is disposed over the dielectric layer 602. In some embodiments, the gate dielectric layer 612 is conformally formed over the gate electrode 610. In some embodiments, the transistor 620 is at least partially disposed in or encapsulated by a dielectric layer Milan over the dielectric layer 602.

In some embodiments, the source electrode 616S and the drain electrode 616D are at least partially horizontally aligned with the semiconductor layer 614. For example, the source electrode 616S may be divided into an upper portion and a lower portion, and the upper portion of the source electrode 616S is horizontally aligned with the semiconductor layer 614. In some embodiments, the drain electrode 616D may be divided into an upper portion and a lower portion, and the upper portion of the drain electrode 616D is horizontally aligned with the semiconductor layer 614. In some embodiments, a thickness of the source electrode 616S or a thickness of the drain electrode 616D is greater than or substantially equal to a thickness of the semiconductor layer 614. In some embodiments, a distance between the source electrode 616S and the drain electrode 616D is greater than or substantially equal to a length of the semiconductor layer 614.

Figure 7:
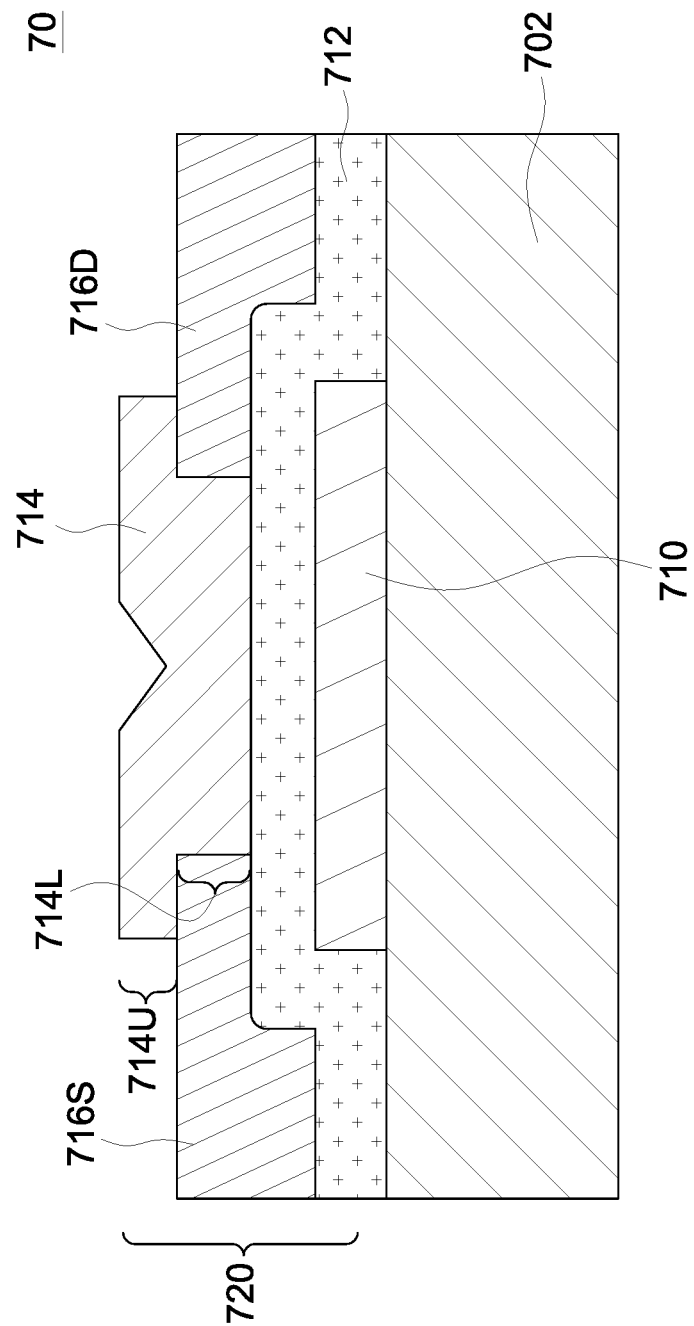
FIG. 7 is a cross-sectional view illustrating a semiconductor structure according to aspects of the present disclosure in one or more embodiments.

FIG. 7 is a cross-sectional view illustrating a semiconductor structure 70 according to aspects of the present disclosure in one or more embodiments. Referring to FIG. 7, the semiconductor structure 70 includes a dielectric layer 702 and a transistor 720. The transistor 720 may be arranged in any one or more of the dielectric layers shown in FIG. 4 as previously discussed. The transistor 720 may be disposed over the dielectric layer 702. Many aspects of the semiconductor structure 70 are similar to those of the semiconductor structure 60, and repeated descriptions thereof are omitted for brevity.

In some embodiments, the transistor 720 includes a gate electrode 710, a gate dielectric layer 712, a semiconductor layer 714, a source electrode 716S and a drain electrode 716D. The source electrode 716S and the drain electrode 716D are disposed over the gate dielectric layer 712 and contact the gate dielectric layer 712. In some embodiments, the transistor 720 is at least partially disposed in or encapsulated by a dielectric layer IMDn over the dielectric layer 702. In some embodiments, the semiconductor layer 714 is formed after the formation of the source electrode 716S and the drain electrode 716D.

In some embodiments, the source electrode 716S and the drain electrode 716D are at least partially horizontally aligned with the semiconductor layer 714. In some embodiments, the semiconductor layer 714 includes an upper portion 714U and a lower portion 714L, in some embodiments, the source electrode 716S may be divided into an upper portion and a lower portion, and the upper portion of the source electrode 716S is horizontally aligned with the lower portion 714L of the semiconductor layer 714. In some embodiments, the drain electrode 716D may be divided into an upper portion and a lower portion, and the upper portion of the drain electrode 716D is horizontally aligned with the lower portion 714L of the semiconductor layer 714, In some embodiments, a thickness of the source electrode 716S or a thickness of the drain electrode 716D is greater than or substantially equal to a thickness of the semiconductor layer 714.

Based on the above, the present disclosure offers semiconductor structures and methods for forming the semiconductor structures. The source electrode and the drain electrode of the semiconductor structure are at least partially horizontally aligned with the semiconductor layer. A shorter current path of the semiconductor structure can be achieved since the source electrode and the drain electrode are aligned with the semiconductor layer. Accordingly, the high resistance issue can be mitigated.

The present disclosure provides many different embodiments of semiconductor structures and methods for forming the semiconductor structures that provide one or more improvements over existing approaches. In some embodiments, a semiconductor structure is provided. The semiconductor structure includes a dielectric layer and a transistor. The transistor is at least partially disposed in the dielectric layer. The transistor includes a gate electrode, a gate dielectric layer, a source electrode, a drain electrode and a semiconductor layer. The gate dielectric layer is disposed over the gate electrode. The source electrode and the drain electrode are disposed over the gate dielectric layer and contact the gate dielectric layer. The semiconductor layer is disposed over the gate dielectric layer.

According to an embodiment, a memory selector is provided. The selector includes a gate electrode, a gate dielectric layer, a semiconductor layer, a source electrode, a drain electrode and a drain via. The gate electrode is embedded in a dielectric layer. The gate dielectric layer is over the gate electrode. The semiconductor layer is over the gate dielectric layer. The source electrode and the drain electrode are horizontally aligned with the semiconductor layer and contact the gate dielectric layer. The drain via electrically connects the drain electrode to a memory element.

According to an embodiment, a method for forming a semiconductor structure is provided. The method includes the following operations. A first dielectric layer is received. A gate electrode is formed in the first dielectric layer. A gate dielectric layer is formed over the first dielectric layer. A patterned semiconductor layer is formed over the gate dielectric layer. A source electrode and a drain electrode are formed in the patterned semiconductor layer over the gate dielectric layer, A second dielectric layer is formed over the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a dielectric layer;
a transistor at least partially in the dielectric layer, wherein the transistor comprises:
a gate electrode;
a gate dielectric layer over the gate electrode;
a source electrode and a drain electrode over the gate dielectric layer and contacting the gate dielectric layer; and
a semiconductor layer over the gate dielectric layer and contacting the gate dielectric layer, wherein each of the source electrode and the drain electrode comprises a conductive material different from a material of the semiconductor layer, and a sidewall of the source electrode or a sidewall of the drain electrode contacts a sidewall of the semiconductor layer.

2. The semiconductor structure according to claim 1, wherein a bottom surface of the source electrode or a bottom surface of the drain electrode is horizontally aligned with a bottom surface of the semiconductor layer.

3. The semiconductor structure according to claim 1, wherein a length of the semiconductor layer is less than a length of the gate dielectric layer.

4. The semiconductor structure according to claim 1, wherein a length of the semiconductor layer is less than or equal to a length of the gate electrode.

5. The semiconductor structure according to claim 1, wherein the source electrode penetrates the semiconductor layer.

6. The semiconductor structure according to claim 1, wherein a distance between the source electrode and the drain electrode is substantially equal to a length of the semiconductor layer.

7. The semiconductor structure according to claim 1, wherein the dielectric layer includes an inter-metal dielectric layer.

8. The semiconductor structure according to claim 1, wherein the transistor is disposed in an interconnection structure.

9. The semiconductor structure according to claim 1, wherein the transistor is configured as a selector for a memory element.

10. The semiconductor structure according to claim 9, further comprising:
a drain via electrically connecting the drain electrode of the transistor to the memory element.

11. A memory selector, comprising:
a gate electrode embedded in a dielectric layer;
a gate dielectric layer over the gate electrode;
a semiconductor layer over the gate dielectric layer;
a source electrode and a drain electrode horizontally aligned with the semiconductor layer and contacting the gate dielectric layer, wherein each of the source electrode and the drain electrode comprises a conductive material different from a material of the semiconductor layer; and
a drain via electrically connecting the drain electrode to a memory element.

12. The memory selector according to claim 11, wherein the memory element comprises a free layer, a reference layer and a tunnel barrier layer between the free layer and the reference layer.

13. The memory selector according to claim 11, wherein a top surface of the source electrode or a top surface of the drain electrode is level with a top surface of the semiconductor layer.

14. The memory selector according to claim 11, wherein a bottom surface of the drain via is level with a top surface of the semiconductor layer.

15. The memory selector according to claim 11, wherein a thickness of the source electrode or a thickness of the drain electrode is substantially equal to a thickness of the semiconductor layer.

16. The memory selector according to claim 11, wherein the source electrode and the drain electrode are embedded in the semiconductor layer.

17. A semiconductor structure, comprising:
a substrate;
a transistor disposed over the substrate; and
a memory element disposed over the transistor and electrically connected to the transistor,
wherein the transistor comprises:
a gate electrode;
a source electrode and a drain electrode over the gate electrode; and
a semiconductor layer, wherein the source electrode and the drain electrode are embedded within the semiconductor layer, and wherein each of the source electrode and the drain electrode comprises a conductive material different from a material of the semiconductor layer.

18. The semiconductor structure according to claim 17, wherein a top surface of the semiconductor layer is substantially aligned with a top surface of the drain electrode.

19. The semiconductor structure according to claim 17, wherein the source electrode penetrates the semiconductor layer.

20. The semiconductor structure according to claim 17, further comprising:
a gate dielectric layer in contact with the source electrode, the drain electrode, and the semiconductor layer.

* * * * *